(12) United States Patent
Brisbin et al.

(10) Patent No.: US 6,946,706 B1
(45) Date of Patent: Sep. 20, 2005

(54) LDMOS TRANSISTOR STRUCTURE FOR IMPROVING HOT CARRIER RELIABILITY

(75) Inventors: Douglas Brisbin, San Jose, CA (US); David Tsuei, Sunnyvale, CA (US); Alexander H. Owens, Los Gatos, CA (US); Andy Strachan, Los Gatos, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 12 days.

(21) Appl. No.: 10/616,381

(22) Filed: Jul. 9, 2003

(51) Int. Cl.$^7$ .............................................. H01L 29/76
(52) U.S. Cl. ...................... 257/343; 257/401; 257/342
(58) Field of Search .............................. 257/341–343, 257/401, 409, 204, E29.026, E29.027, 339

(56) References Cited

U.S. PATENT DOCUMENTS

| | | | |
|---|---|---|---|
| 5,517,046 A | 5/1996 | Hsing et al. ................. | 257/336 |
| 5,635,742 A * | 6/1997 | Hoshi et al. ................. | 257/337 |
| 6,144,069 A | 11/2000 | Tung ........................... | 257/335 |
| 6,177,834 B1 | 1/2001 | Blair et al. ................... | 327/566 |
| 6,297,533 B1 | 10/2001 | Mkhitarian .................. | 257/336 |
| 6,437,402 B1 * | 8/2002 | Yamamoto ................... | 257/342 |
| 6,548,839 B1 | 4/2003 | Strachan et al. ............ | 257/204 |
| 6,566,710 B1 | 5/2003 | Strachan et al. ............ | 257/341 |
| 2002/0072159 A1 * | 6/2002 | Nishibe et al. .............. | 438/179 |

OTHER PUBLICATIONS

D. Brisbin et al., "Design Optimization of N-LDMOS Transistor Arrays for Hot Carrier Lifetime Enhancement," *International Reliability Physics Symposium Proceedings 2003*, pp. 608-609 (2 pages in length).

D. Brisbin et al., "Hot Carrier Reliability of N-LDMOS Transistor Arrays for Power BiCMOS Applications," *International Reliability Physics Symposium Proceedings 2002*, pp. 105-110 (6 pages in length).

U.S. Appl. No. 10/266,543, filed Oct. 8, 2002, entitled: "Method and device for improving hot carrier reliability of an LDMOS transistor using drain ring over-drive bias," by Douglas Brisbin et al., 16 pages in length.

* cited by examiner

*Primary Examiner*—Tom Thomas
*Assistant Examiner*—Matthew C Landau
(74) *Attorney, Agent, or Firm*—Stallman & Pollock LLP

(57) ABSTRACT

An LDMOS structure which provides for reduced hot carrier effects. The reduction in hot carrier effects is achieved by increasing the size of the drain region of the LDMOS relative to the size of the source region. The larger size of the drain region reduces the concentration of electrons entering the drain region. This reduction in the concentration of electrons reduces the number of impact ionizations, which in turn reduces the hot carrier effects. The overall performance of the LDMOS is improved by reducing the hot carrier effects.

16 Claims, 4 Drawing Sheets

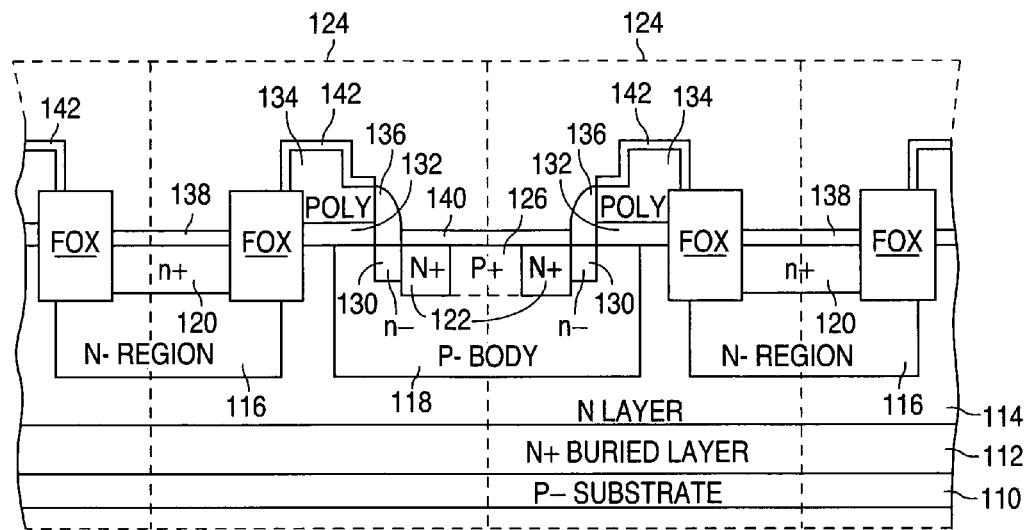
FIG. 2
(PRIOR ART)
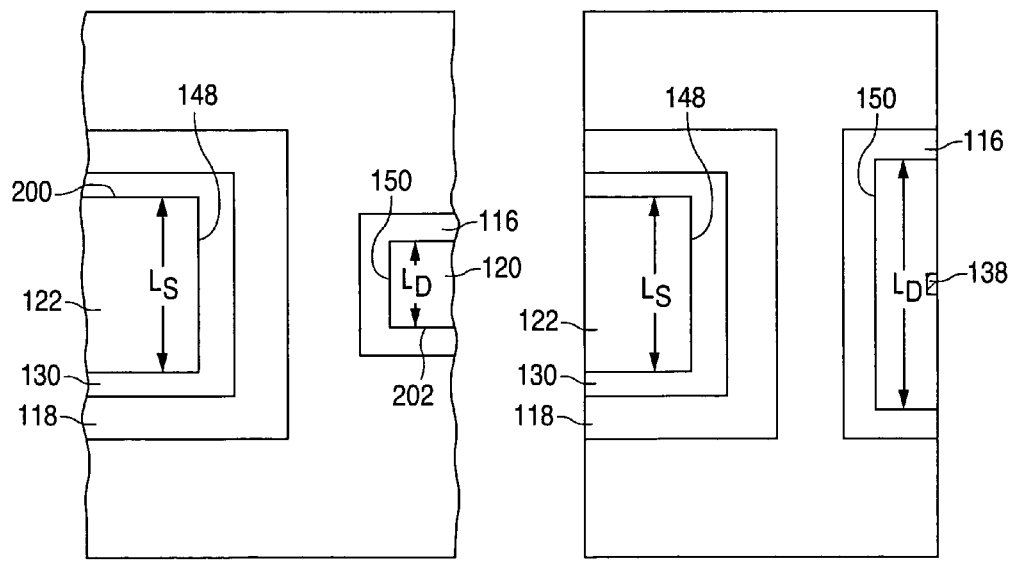
FIG. 3a
(PRIOR ART)
FIG. 3b

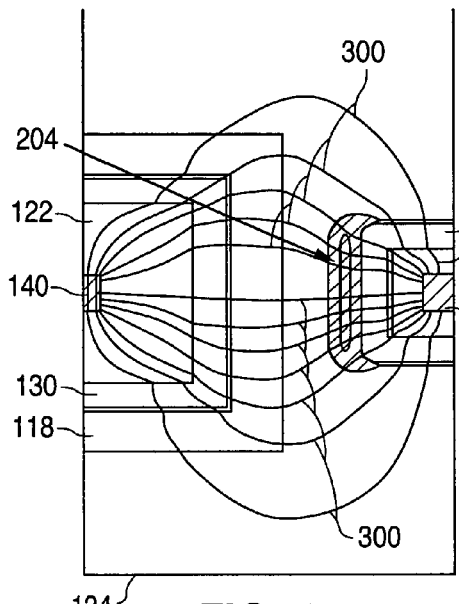
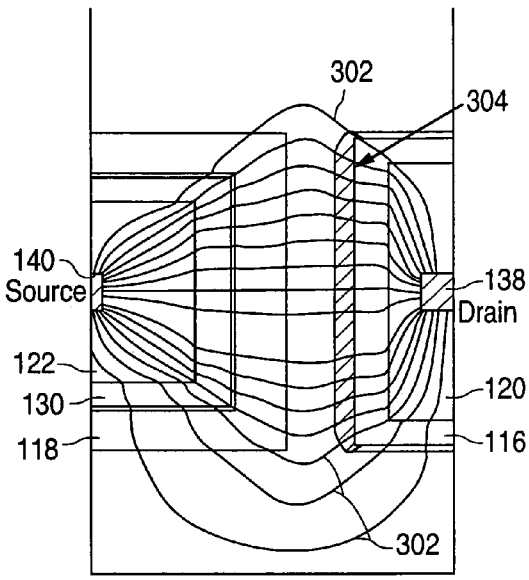
FIG. 4a
(PRIOR ART)
FIG. 4b
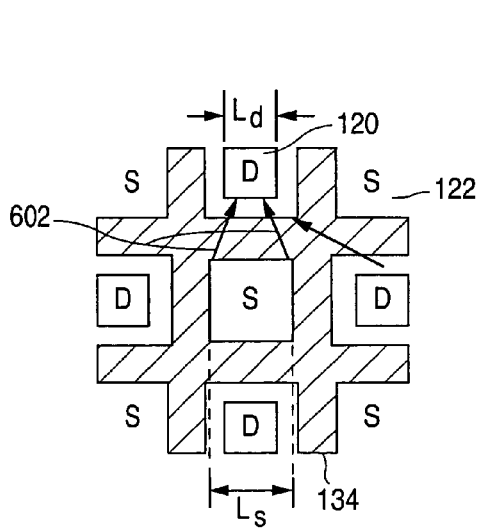
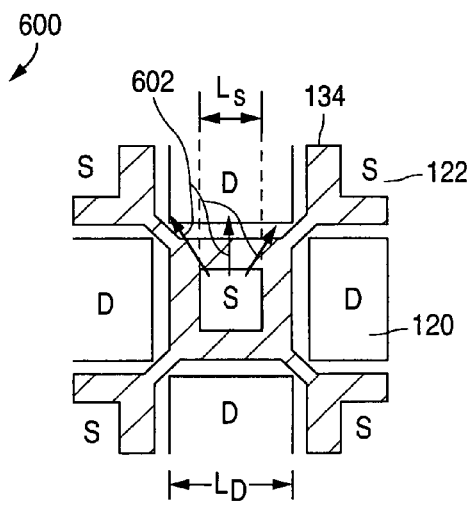
FIG. 6a
(PRIOR ART)
FIG. 6b

LDMOS TRANSISTOR STRUCTURE FOR IMPROVING HOT CARRIER RELIABILITY

FIELD OF THE INVENTION

The invention relates to semiconductor devices, and particularly LDMOS transistors, and defines a method and device for improving hot carrier reliability.

DESCRIPTION OF RELATED ART

A power MOSFET is a high-voltage transistor that conducts large amounts of current when turned on. A lateral drift-diffused MOS (LDMOS), sometimes referred to as a lateral double diffused MOS, transistor is one type of power MOSFET. These devices are typically used at high voltages and currents (e.g. 20V and 10 A/mm$^2$). Under these conditions, as is discussed in more detail below, hot carrier effects occur and cause degradation of device parameters such as threshold voltage, gain and on-resistance (Rdson). For LDMOS transistors the most susceptible parameter to hot electron effects is the on-resistance. Elements and aspects of the LDMOS transistors are discussed in detail in numerous references including U.S. Pat. No. 6,566,710 entitled POWER MOSFET CELL WITH CROSSED BAR SHAPED BODY CONTACT AREA; and U.S. Pat. No. 6,548,839 entitled LDMOS TRANSISTOR STRUCTURE USING A DRAIN RING WITH A CHECKERBOARD PATTERN FOR IMPROVED HOT CARRIER RELIABILITY, both of these references are assigned to the same assignee as the present application, and are incorporated herein in their entirety.

An LDMOS transistor is commonly implemented with an array of alternating drain regions and alternating source regions rather than with a single drain region and a single source region. Each adjacent drain and source region can be referred to as a transistor cell. In the LDMOS transistor, the drain and source regions, each contribute a portion of the total current output by the transistor.

FIG. 1 shows a plan view that illustrates a conventional checkerboard-patterned, n-channel LDMOS transistor 100. FIG. 2 shows a cross-sectional diagram of transistor array 100 taken along lines 2—2 of FIG. 1.

As shown in FIGS. 1–2, transistor 100, which is formed on a p– semiconductor substrate 110, includes an n+ buried layer 112 that is formed on substrate 110, and an n drift layer 114 that is formed on buried layer 112. Transistor 100 also includes an alternating pattern of n– field regions 116 and p– body regions 118 that are formed in layer 114.

Further, transistor array 100 includes a checkerboard pattern of drain regions 120 and source regions 122 of a first conductivity type (n+). The drain regions 120 are formed in n-regions 116 and the source regions 122 are formed in p–regions 118. Adjacent drain and source regions 120 and 122, in turn, define a number of transistor cells 124. All of the source regions 120 are connected in parallel utilizing a conduction, preferably metal (e.g. Al) source interconnect structure 146. Similarly, all of the drain regions 120 are connected in parallel utilizing a conductive preferably metal (e.g. Al), drain interconnect structure 144.

Thus, as shown in FIG. 1, except for the drain regions 120 on the outside edge of the pattern, each drain region 120 is a part of four transistor cells 124. Similarly, except for the source regions 122 on the outside edge of the pattern, each source region 122 is a part of four transistor cells 124. As a result, the center source region 122 shown in FIG. 1 receives current from four drain regions 120: the drain region directly above the center region, the drain region directly below the center region, the drain region directly left of the center region, and the drain region directly right of the center region.

As shown in FIG. 1 the source regions are generally square in shape having source region faces 148. These source region faces have an area which is determined by the source region face length (Ls) and by the depth of the source region, which is very shallow relative to the length of the face. Similarly, the drain regions are generally square in shape and have drain region faces 150. The drain region faces have an area which is defined by the drain region face length, and by the depth of the drain region, which is generally the same depth as the source region, and is very shallow relative to the drain region face length, Ld.

Transistor array 100 additionally includes a number of p+ contact regions 126 that are formed in p– regions 118 adjacent to source region 122, and a number of n– regions 130 that are formed in p– regions 118 adjacent to source region 122. Transistor array 100 also includes a number of field oxide regions FOX that surround drain regions 120, and a layer of gate oxide 132 that is formed over a portion of each body region 118 and an adjoining drift region 114. The field oxide region FOX separates drain region 120 from source region 122. (Drain region 120 and source region 122 can alternately be separated by a gap.)

Further, a gate 134 is formed between each drain and source region 120 and 122 on gate oxide layer 132 and the adjoining field oxide region FOX. In addition, an oxide spacer 136 is formed adjacent to each gate 134 over n–region 130. A salicide layer is also formed on each drain region 120 to form drain contacts 138, source region/contact region 122/126 to form source body contacts 140, and gate 134 to form gate contacts 142.

In operation, when the junction of drift region 114 and p–body region 118 of a transistor cell 124 is reverse biased (the combination of the regions 114 and 118 can be referred to as a channel region), such as when no voltage (or a low voltage or negative voltage is applied to the gate 134) and when a positive voltage is applied to drain contact 138 and ground is applied to source body contact 140 of the cell, an electric field is established across the junction. The electric field, in turn, forms a depletion region around the junction that is free of mobile charge carriers. Alternatively, when a positive voltage (such as 5 volts) is applied to the gate, the junction of the drift region 114 and the p– body region 118 is populated with carriers and is conducting with a relatively low on-resistance (rdson).

In the reversed biased state, when the voltage on drain contact 138 of the cell is increased, the strength of the electric field is also increased. When the voltage on drain contact 138 exceeds a snapback voltage, mobile charge carriers in the depletion region, such as electrons from thermally-generated, electron-hole pairs, are accelerated under the influence of the electric field into having ionizing collisions with the lattice.

The ionizing collisions, in turn, form more mobile charge carriers which then have more ionizing collisions until, by a process known as avalanche multiplication, a current flows across the junction between drift region 116 and p– body 118. The holes that flow into p– body region 118 are collected by p+ contact region 126, while the electrons that flow into drift region 118 are collected by drain region 120. The electrons collected by the drain region 120 are subject to a relatively high electric potential by virtue of the voltage applied to the drain contact 138. As the electrons move closer to the drain region they are subjected to increasing electric potential, and this increasing potential operates to accelerate the electrons thereby increasing their velocity. As the velocity of the electrons increases, the electrons create increasing amounts of ionizing collisions (impact ionization) with the atoms of the lattice structure. The impact ionization results in hot electron effects, or hot carrier effects. As the hot carrier effects increase due to increased impact ionization, the overall operation of the transistor cell and the overall transistor array can be degraded. It is believed that this degradation is the result of a number of factors, including the embedding of electrons in the gate oxide and the FOX areas.

BRIEF DESCRIPTION OF THE DRAWINGS

FIG. 2 is a cross-sectional diagram of transistor 100 taken along lines 2—2 of FIG. 1.

FIG. 3a is a top view of a portion of a conventional LDMOS cell.

FIG. 3b is a top view of a portion of an LDMOS cell of an embodiment of the invention.

FIG. 4a is a top view of a portion of a conventional LDMOS cell showing modeled current between a source region and a drain region of a conventional LDMOS cell.

FIG. 4b is a top view of a portion of an LDMOS cell showing modeled current between a source region and a drain region of an embodiment of the present invention of an LDMOS cell.

FIG. 6a is a simplified plan view showing a portion of a conventional LDMOS transistor.

FIG. 6b is a simplified plan view showing a portion of an LDMOS transistor of an embodiment of the invention.

DETAILED DESCRIPTION

Figure 1:
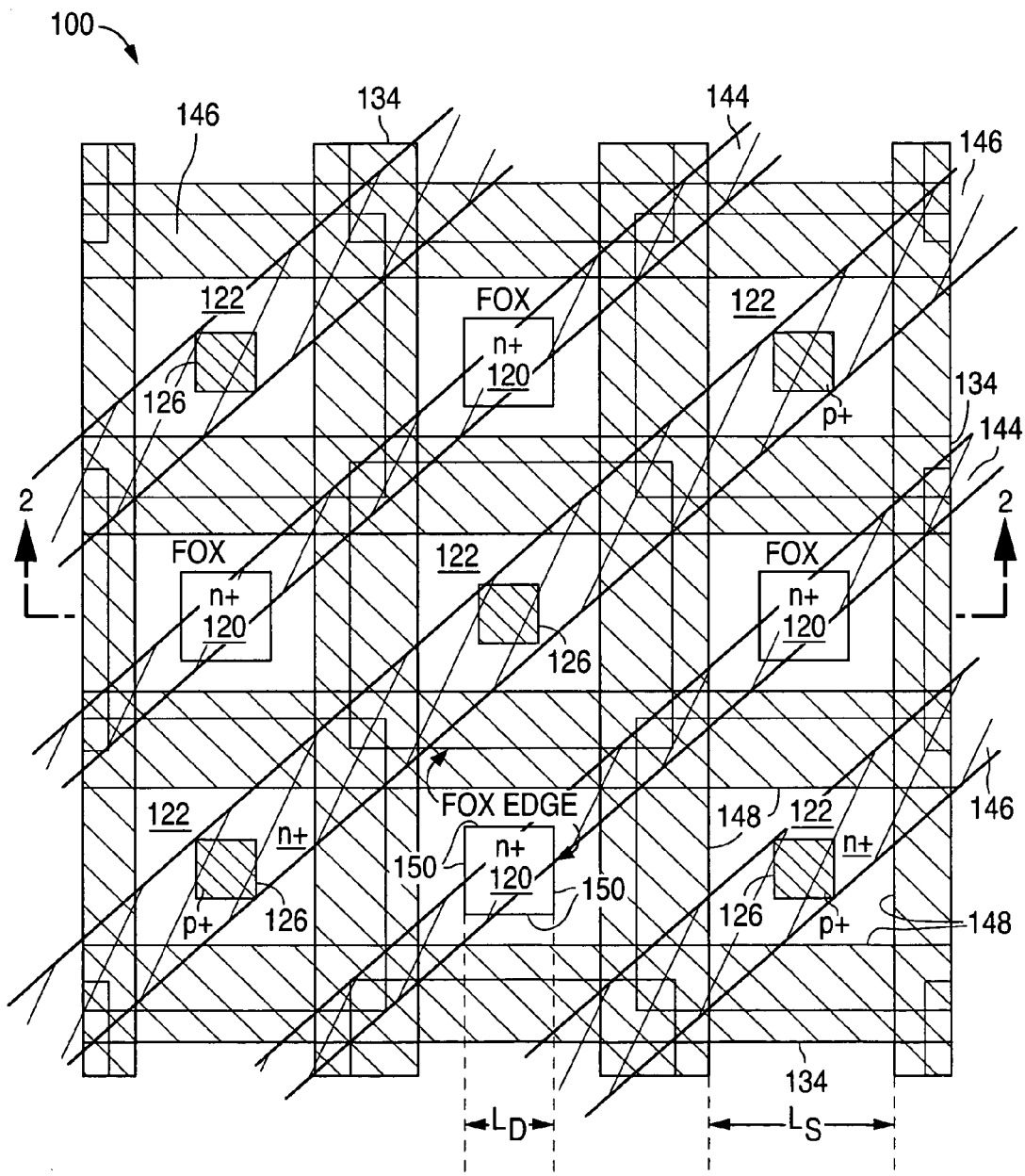
FIG. 1 is a plan view illustrating a conventional checkerboard patterned, n-channel LDMOS transistor 100.

FIG. 3a shows a top view of a portion of a source region 122 and a portion of a drain region 120 of a transistor cell. FIG. 3a does not show all the elements of the transistor such as the poly gate 134 or the FOX region, so as to better illustrate elements of the cell disposed in the substrate. FIG. 4a displays model (simulation) data and corresponds to FIG. 3a, and shows curved lines 300, which represent current flowing from the drain region 120 to the source region 122, which corresponds, in part, to electrons moving from the source region to the drain region. The drain region 120 and the region 116 which have faces which are orientated toward the source region 122. The source region 122 has a source region face 148 which is orientated toward the drain region 120. In operation electrons converge on faces of the region 116 the drain region 120 which results in the concentration of the electrons increasing as the electrons get closer to the drain region 120. Further as the electron concentration increases, as the electrons converge on the drain region face 150 and region 116, the electrons are also subject to an increasing electric potential, as a result of the voltage applied to the contact 138 of the drain region 120. As discussed this concentration of mobile electrons with the increasing electric potential results in increasing electron velocity and in increasing numbers of impact ionizations which increases the hot carrier effects. An area of increased impact ionizations is represented by the area 204.

FIG. 3b shows a view of a portion of a cell of an embodiment of the present invention. As shown the length Ls of the source region face 148 in less than the length Ld of the drain region face 150. This is in contrast the prior LDMOS shown in FIG. 3a where the length Ls of the source region face 148 is greater than length Ld of the drain region face 150.

In one embodiment of the present invention the length Ls of the source region face 148 is approximately 2.75 μm and the length Ld of the drain region face is approximately 5.4 μm. As a result the area on the drain region 120 which collects electrons is larger than the area of the source region 122 which emits electrons. Thus, the concentration of electrons in the area of the drain region 120, where the electric potential is high, is less than the concentration of electrons in the area of the source region where the electric potential is less than the electric potential in the area of the drain region.

FIG. 4b displays model (simulation) data and corresponds to FIG. 3b and shows curved lines 302 which represent current flowing from the drain region 120 to the source region 122 (which corresponds to electrons flowing from the source to the drain). As is represented by the area 304 the concentration of electrons in the area of the drain region 120 and the region 116 is reduced relative to concentration of the electrons for the prior device shown in FIG. 3a. This reduction in concentration of electrons in the area drain region results in less impact ionizations, reducing the hot carrier degradation effects.

This reduction in hot carrier effects by reducing the concentration of electrons in the area of the drain region 120, achieved by increasing the length of the drain region face 150 relative to the source region face 148, has significant benefits in improving the hot carrier performance of the LDMOS transistor.

Figure 5:
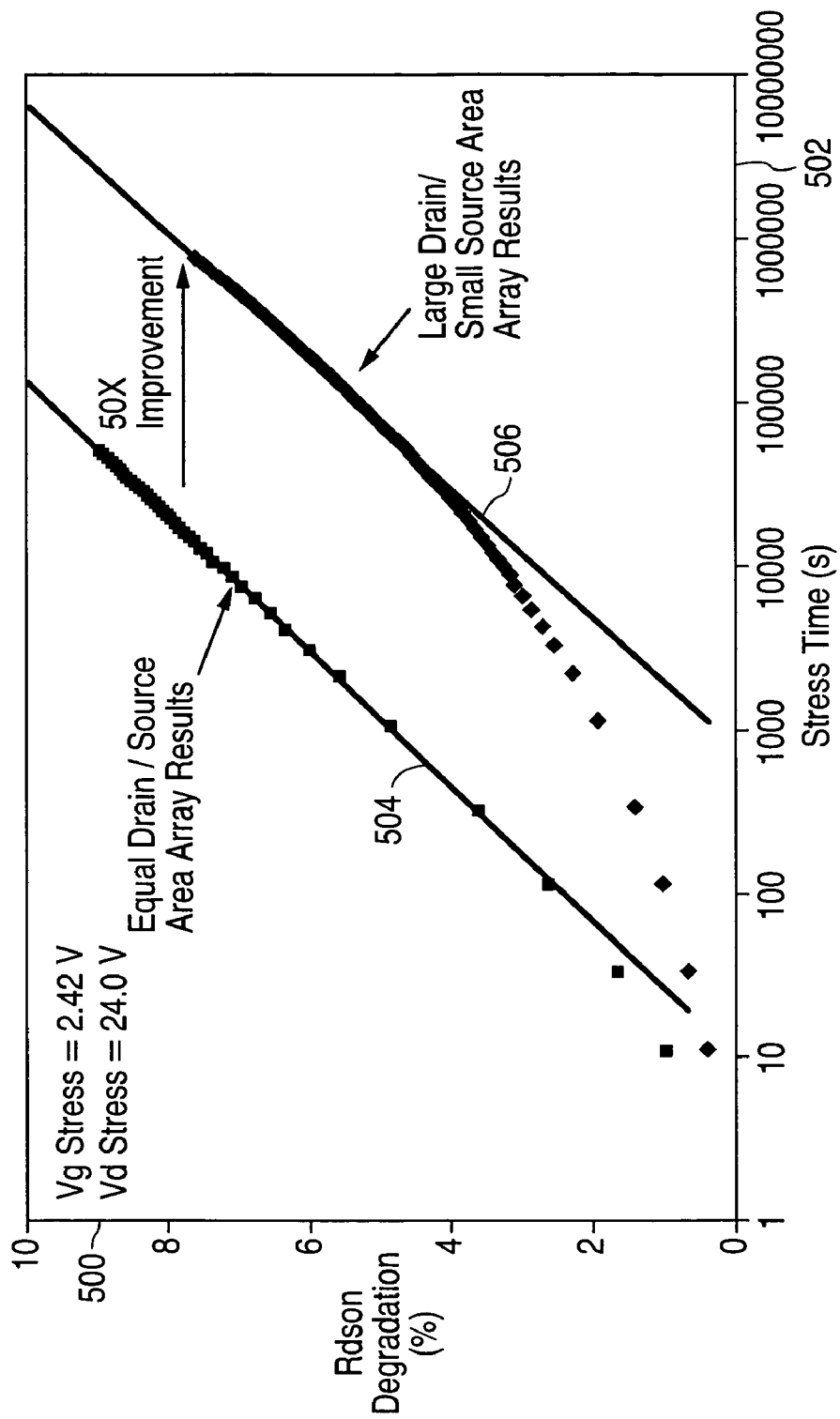
FIG. 5 is a table showing actual test data comparing the performance of an embodiment of the invention with a convention LDMOS transistor.

One of the most apparent benefits of increasing the length of the drain region face 150 relative to the source region face 148 is shown in the degradation of the Rdson overtime as the LDMOS is subject to gate and drain voltage stress conditions. For example, FIG. 5 shows actual test data for a CMOS LDMOS transistor where an electric potential of 2.42 volts is applied to the gate 134 and a potential of 24 volts is applied to the drain contact 138 and the voltage at the source contact is approximately 0 (zero) volts. The vertical axis 500 in FIG. 5 shows the percentage of degradation in Rdson and the horizontal axis 502 shows the amount of time the LDMOS is subjected to the stress condition. Line 504 shows the degradation of Rdson for a device where the drain region and the source region are of equal area (equal lengths for the source region face and drain region face, and substantially the same depths for the source region and drain regions). Line 506 corresponds the degradation Rdson for a LDMOS device where the length of the drain region is twice that of the length of the source region face. As is shown in FIG. 5 the LDMOS having the longer drain region face can withstand much longer periods of stress and still not have as much degradation in the Rdson as the LDMOS device where the drain region face and the source region face are the same length. In fact, as shown in FIG. 5 the device having the longer drain region face shows approximately 50 times greater performance in Rdson degradation over a device where the drain region face and the source region face are equal. This means that LDMOS device having a longer drain region face can provide a much longer operational life in terms of maintaining a desired Rdson consistency relative to a conventional LDMOS device.

FIG. 6a shows a simplified plan view of a portion of a conventional LDMOS transistor. As shown in FIG. 6a the length Ld for the face of the drain region 120 is about 70% of the length Ls of a face for the source region 122. The polygate 134 is shown between the alternating source regions 122 and of the alternating drain regions 120. Arrows 602 represent electrons flowing from the source to the drain. As shown the arrow indicate that electrons will become increasing more concentrated as the approach the face of the drain region 120. FIG. 6b shows a simplified plan view of an embodiment of an LDMOS transistor of the present invention. As shown in FIG. 6b the length Ld for the face of the drain region 120 is about twice the length Ls of a face for the source region 122. The polygate 134 is shown between the alternating source regions 122 and of the alternating drain regions 120. Arrows 602 represent electrons flowing from the source to the drain. As shown the arrow indicate that electrons will become increasingly more spread out as they approach the face of the drain region 120.

Although only specific embodiments of the present invention are shown and described herein, the invention is not to be limited by these embodiments. Rather, the scope of the invention is to be defined by these descriptions taken together with the attached claims and their equivalents.

What is claimed is:

1. An LDMOS transistor array structure comprising:
    an array that includes a plurality of alternating source regions and a plurality of alternating drain regions formed in a semiconductor substrate to define a checkerboard pattern of said alternating source and drain regions, wherein at least a first source region of the alternating source regions includes a first source region outer face which is orientated toward a first drain region face of a first drain region of the plurality of alternating drain regions, and wherein the first drain region face has a drain region face length and the source region outer face has a source region face length, and wherein the drain region face length is greater than the source region face length, wherein the first source region is disposed between the first drain region and a second drain region, and the first source is the only source region between the first drain region and the second drain region and the first source region is a contiguous region having a first conductivity type;
    a conductive source region interconnect structure formed in electrical contact with each of the plurality of alternating source regions in the array to electrically connect said source regions in parallel; and
    a conductive drain region interconnect structure formed in electrical contact with each of the plurality of alternating drain regions in the array to electrically connect said drain regions in parallel.

2. The LDMOS transistor array structure as in claim 1, wherein the drain region face length is at least 1.5 times greater than the source region face length.

3. The LDMOS transistor array structure as in claim 1, wherein the drain region face length is at least twice as long as the source region face length.

4. The LDMOS transistor array structure as in claim 1, wherein the source region outer face has a source region face depth, and the drain region face has a drain region face depth, and the source region face depth and the drain region face depth are substantially equal in length.

5. An LDMOS transistor array structure as in claim 1, wherein each of the alternating source regions has four source region outer faces, and each of the source region outer faces has the same source region face length, and wherein each of the alternating drain regions has four faces, and each of the drain region faces has the same drain region face length.

6. The LDMOS transistor array structure as in claim 5, wherein the drain region face length is at least 1.5 times greater than the source region face length.

7. The LDMOS transistor array structure as in claim 5, wherein the drain region face length is at least twice as long as the source region face length.

8. The LDMOS transistor array structure as in claim 5, wherein the source region outer faces have a source region face depth, and the drain region faces have a drain region face depth, and the source region face depth and the drain region face depth are substantially equal in length.

9. An high power transistor, including:
    a source region which includes a first source region outer face wherein the source region outer face has a source region face length, wherein the source region is a contiguous region of first conductivity type;
    a first drain region which includes a first drain region face wherein the first drain region face has a drain region face length;
    a second drain region which includes a second drain region face wherein the second drain region face has the drain region face length;
    wherein the source region is the only source region disposed between the first drain region face and the second drain region face;
    a source contact coupled with the source region;
    a drain contact coupled with the first drain region, and the second drain region;
    a channel region disposed between the source region and the first drain region face and a second channel between the source region and the second drain region face;
    wherein in response to a voltage applied across the source contact and the drain contact electrons flow from the source region to the first drain region and the second drain region; and
    wherein the drain region face length is longer than the source region face length.

10. The high power transistor as in claim 9, wherein the drain region face length is at least 1.5 times greater than the source region face length.

11. The high power transistor as in claim 9, wherein the drain region face length is at least twice as long as the source region face length.

12. The high power transistor as in claim 9, wherein the source region outer face has a source region face depth, and the drain region face has a drain region face depth, and the source region face depth and the drain region face depth are substantially equal in length.

13. The high power transistor as in claim 9, further including:
    a plurality of alternating source regions each source region including four source region faces, and each of the source region faces has the same source region face length;
    a plurality of alternating drain regions, each of the drain regions having four faces, and each of the drain region faces has the same drain region face length.

14. An LDMOS transistor array structure comprising:
    an array that includes a plurality of alternating source regions and a plurality of alternating drain regions formed in a semiconductor substrate to define a checkerboard pattern of said alternating source and drain regions, wherein at least a first source region of the alternating source regions includes a first source region face which is orientated toward a first drain region face of a first drain region of the plurality of alternating drain regions, and wherein the first drain region face has a drain region face length and the source region face has a source region face length, and wherein the drain region face length is greater than the source region face length, wherein the first source region is disposed between the first drain region and a second drain region, and the first source is the only source region between the first drain region and the second drain region and the first source region is a contiguous region having a first conductivity type;

a conductive source region interconnect structure formed in electrical contact with each of the plurality of alternating source regions in the array to electrically connect said source regions in parallel;

a conductive drain region interconnect structure formed in electrical contact with each of the plurality of alternating drain regions in the array to electrically connect said drain regions in parallel; and wherein the drain region face length is at least twice as long as the source region face length.

15. An LDMOS transistor array structure as in claim 14, wherein each of the alternating source regions has four source region faces, and each of the source region faces has the same source region face length, and wherein each of the alternating drain regions has four faces, and each of the drain region faces has the same drain region face length.

16. An high power transistor, including:

a source region which includes a first source region face wherein the source region face has a source region face length, wherein the source region is a contiguous region of first conductivity type;

a first drain region which includes a first drain region face wherein the first drain region face has a drain region face length;

a second drain region which includes a second drain region face wherein the second drain region face has the drain region face length;

wherein the source region is the only source region disposed between the first drain region face and the second drain region face;

a source contact coupled with the source region;

a drain contact coupled with the first drain region, and the second drain region;

a channel region disposed between the source region and the first drain region face and a second channel between the source region and the second drain region face;

wherein in response to a voltage applied across the source contact and the drain contact electrons flow from the source region to the first drain region and the second drain region;

wherein the drain region face length is longer than the source region face length; and wherein the drain region face length is at least twice as long as the source region face length.

\* \* \* \* \*